(12) United States Patent
Tanaka et al.

(10) Patent No.: US 6,336,990 B1
(45) Date of Patent: Jan. 8, 2002

(54) THERMOCOMPRESSION BONDING METHOD FOR ELECTRICALLY AND MECHANICALLY CONNECTING CONDUCTORS

(75) Inventors: Keizo Tanaka; Yoshikazu Yomogihara, both of Himeji (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/108,292

(22) Filed: Jul. 1, 1998

Related U.S. Application Data (62) Division of application No. 08/807,801, filed on Feb. 27, 1997, now Pat. No. 5,810,959.

(30) Foreign Application Priority Data

Feb. 28, 1996 (JP) .............................................. 8-041431
Feb. 24, 1997 (JP) .............................................. 9-039042

(51) Int. Cl.$^7$ ................................................. C09J 5/10
(52) U.S. Cl. ...................... 156/306.9; 29/830; 156/312
(58) Field of Search ............................... 156/306.9, 312; 29/830

(56) References Cited

U.S. PATENT DOCUMENTS

| 4,654,965 | A | * | 4/1987 | Uehara et al. ................. 29/830 |
| 5,318,651 | A | * | 6/1994 | Matsui et al. |
| 5,322,586 | A | * | 6/1994 | McLean ..................... 156/358 |
| 5,545,281 | A | * | 8/1996 | Matsui et al. |
| 5,578,527 | A | * | 11/1996 | Chang et al. |
| 5,667,884 | A | * | 9/1997 | Bolger |
| 5,749,997 | A | * | 5/1998 | Tang et al. ................. 156/312 |

\* cited by examiner

*Primary Examiner*—John J. Gallagher
(74) *Attorney, Agent, or Firm*—Oblon, Spivak, McClelland, Maier & Neustadt, P.C.

(57) ABSTRACT

A tape carrier package is stacked on an array substrate while interposing a thermosetting type anisotropic conductive adhesive between a plurality of first conductors formed on the end portion of the array substrate and a plurality of second conductors formed on the tape carrier package. Subsequently, a heater tool of a thermocompression bonding apparatus applies pressure and heat to the anisotropic conductive adhesive via the tape carrier package. In this case, the anisotropic conductive adhesive is slowly heated up to its hardening end temperature to harden after it softens, thereby thermocompression bonding the first and second conductors to each other by the anisotropic conductive adhesive.

13 Claims, 7 Drawing Sheets

THERMOCOMPRESSION BONDING METHOD FOR ELECTRICALLY AND MECHANICALLY CONNECTING CONDUCTORS

CROSS-REFERENCE TO RELATED APPLICATION

This application is a division and claims priority to parent application Ser. No. 08/807,801 filed Feb. 27, 1997, now U.S. Pat. No. 5,810,959.

BACKGROUND OF THE INVENTION

The present invention relates to a thermocompressing bonding method for electrically and mechanically connecting electronic components such as printed circuit boards and the like using a thermosetting type anisotropic conductive adhesive film.

In recent years, when two printed circuit boards having conductor patterns are to be connected to each other, thermocompressing bonding for connecting them using an anisotropic conductive adhesive film is used. More specifically, according to thermocompressing bonding, when a circuit board having a plurality of parallel conductor patterns and another circuit board having a plurality of parallel conductor patterns at the same pitch as that of the former circuit board are to be electrically and mechanically connected to each other, these circuit boards are arranged so that the conductor patterns face to each other, and a thermosetting anisotropic conductive adhesive film is interposed between these two conductor patterns. In this state, a thermocompressing head applies heat and pressure to the circuit boards and adhesive film from the side above one circuit board. Thus, the anisotropic conductive adhesive film establishes conductivity in its thickness direction, so that the circuit boards are mechanically and electrically connected to each other.

A thermosetting type anisotropic conductive adhesive film is prepared by dispersing metal fine particles (Ni, carbon) in a thermosetting resin film. The thermosetting type anisotropic conductive adhesive film hardens after the resin softens by heating/compressing, thereby mechanically connecting the circuit boards to each other, and the metal fine particles dispersed in the resin form conductive structures, thereby electrically connecting the conductor patterns to each other.

As typical methods of applying heat and pressure in thermocompression bonding, a constant heat method, and pulse heat method are known.

According to the constant heat method, the temperature of the thermocompressing head is maintained constant during the thermocompression bonding process, and a compression force is applied to the circuit boards for a predetermined period of time, thereby changing the temperature of the anisotropic conductive adhesive film.

According to the pulse heat method, a thermocompressing head nearly concurrently applies heat (at a predetermined temperature) and a compression force to the circuit boards for a predetermined period of time, thereby changing the temperature of the anisotropic conductive adhesive film by means of Joule heat produced at that time.

With the constant heat method, thermocompression bonding can be realized by a relatively inexpensive apparatus. However, the freedom of temperature control is low, so that it is difficult to obtain suitable temperature waveforms with respect to a various types of objects.

With the pulse heat method, since the freedom of temperature control is high, a suitable temperature waveform can be easily selected.

However, in the pulse heat method, since the temperature of the thermocompressing head rises quickly, the anisotropic conductive adhesive film abruptly melts and spreads. Thus, the compression force applied to the circuit boards and adhesive film lowers abruptly, so that it is difficult to suppress the thermal expansion of the circuit boards, thereby causing positional shifts of the circuit boards. Further, positional shifts of the circuit boards are also caused by the lowering of the compression force applied to the circuit boards.

Such positional shift of the circuit boards results in electrical connection errors between the conductor patterns, thus considerably impairing the reliability of electrical connections.

BRIEF SUMMARY OF THE INVENTION

The present invention has been made in consideration of the above situation, and has as its object to provide a thermocompression bonding method and apparatus, which can assure stable electrical and mechanical connections between electronic components without causing any positional shift.

In order to achieve the above object, according to the present invention, in a thermocompression bonding method a thermosetting type anisotropic conductive adhesive is interposed between first and second conductors and the first and second conductors are electrically and mechanically connected to each other by applying heat and pressure from the side above the first and second conductors; thermocompression bonding is attained by slowly raising the temperature of the anisotropic conductive adhesive up to its thermosetting end temperature.

In this case, the compression force to be applied to the anisotropic conductive adhesive is raised abruptly, and the temperature of the anisotropic conductive adhesive is slowly increased up to the thermosetting end temperature.

According to the present invention, in a thermocompression bonding method in which a thermosetting type anisotropic conductive adhesive is interposed between first and second conductors and the first and second conductors are electrically and mechanically connected to each other by applying heat and pressure from the side above the first and second conductors; the anisotropic conductive adhesive is instantaneously heated to the softening start temperature, and thereafter, is slowly heated up to the hardening end temperature.

As described above, with the thermocompression bonding method according to the present invention, since the heating temperature of the anisotropic conductive adhesive is slowly increased to the hardening end temperature, the anisotropic conductive adhesive can be prevented from abruptly melting and receding. As a consequence, the compression force applied to the first and second conductors can be prevented from lowering abruptly, and hence, positional shifts between the first and second conductors can be prevented.

Furthermore, a thermocompression bonding method according to the present invention comprises the steps of: stacking conductors of first and second electronic components with interposing a thermosetting type anisotropic conductive adhesive therebetween; applying a pressure to the anisotropic conductive adhesive via one of the first and second electronic components by using a thermocompression bonding head, which produces Joule heat in accordance with a current applied thereto; and supplying a current, which is based on a setting voltage waveform including a first level region, a second level region higher than the first level, and an inclined region between the first and second level regions, to the thermocompression bonding head while applying the pressure, to slowly heat the anisotropic conductive adhesive to a thermosetting end temperature thereof so as to harden the anisotropic conductive adhesive after it softens, thereby thermocompression bonding the conductors of the first and second electronic components by the anisotropic conductive adhesive.

A thermocompression bonding apparatus according to the present invention comprises: a thermocompression bonding head for producing Joule heat in accordance with a current supplied thereto; pressing means for pressing the thermocompression bonding head against one of first and second electronic components which are stacked to sandwich a thermosetting type anisotropic conductive adhesive between conductors thereof, and applying a predetermined pressure to the anisotropic conductive adhesive via one of the first and second electronic components; and current supply means for supplying, to the thermocompression bonding head, a current which is based on a setting voltage waveform including a first level region, a second level region higher than the first level, and an inclined region between the first and second level regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1 to 5 show a thermocompression bonding apparatus according to an embodiment of the present invention, in which:

DETAILED DESCRIPTION OF THE INVENTION

A thermocompression bonding method and apparatus according to an embodiment of the present invention will be described in detail with reference to the accompanying drawings.

In this embodiment, a thermocompression bonding method and apparatus will be described with reference to a case wherein a tape carrier package (hereinafter referred to as a TCP) is thermocompression bonded to an array substrate that constitutes a liquid crystal display panel, and a plurality of lead lines on the array substrate are electrically and mechanically connected to those of the TCP. The TCP has a flexible printed wiring board formed of polyimide and the like, and a driving element mounted thereon. The array substrate and the TCP serve as first and second electronic components, respectively.

Figure 1:
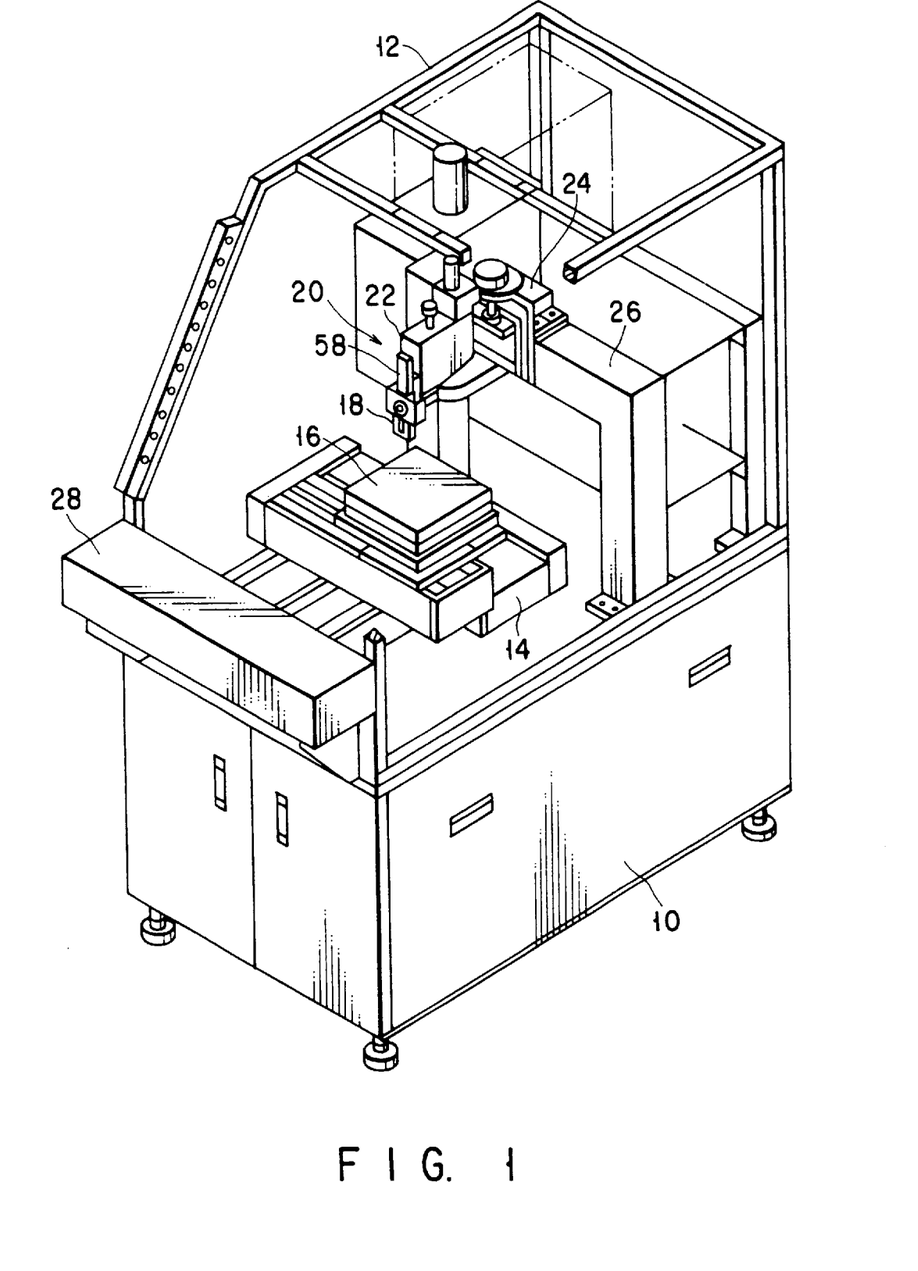
FIG. 1 is a perspective view showing the overall apparatus.

The thermocompression bonding apparatus according to this embodiment will be explained. As shown in FIG. 1, the thermocompression bonding apparatus comprises a base 10 and a support frame 12 mounted on the base. An X-Y table 14 is arranged on the upper surface of the base 10, and on the X-Y table is arranged a stage 16 on which a liquid crystal display panel or the like as a work (to be described later) is placed.

A thermocompression bonding head device 20 comprising a heater tool 18 (to be described later) is arranged above the stage 16. The thermocompression bonding head device 20 is attached to a movable base 24 via an air cylinder 22. The movable base 24 is arranged on a horizontal frame 26, which horizontally extends above the stage 16, of the support frame 12. With this arrangement, the thermocompression bonding head device 20 is vertically and horizontally movable with respect to the stage 16.

An operation panel 28 for controlling the operations of the X-Y table 14, air cylinder 22, heater tool 18, and the like is arranged on the front portion of the support frame 12.

Figure 2A:
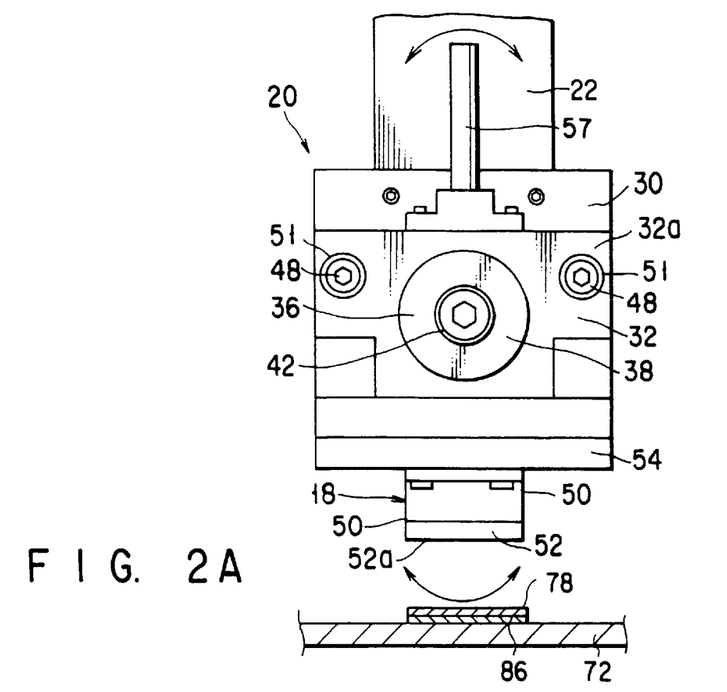
FIGS. 2A and 2B are respectively a front view and a sectional view showing a thermocompression bonding head device of the apparatus.
Figure 2B:
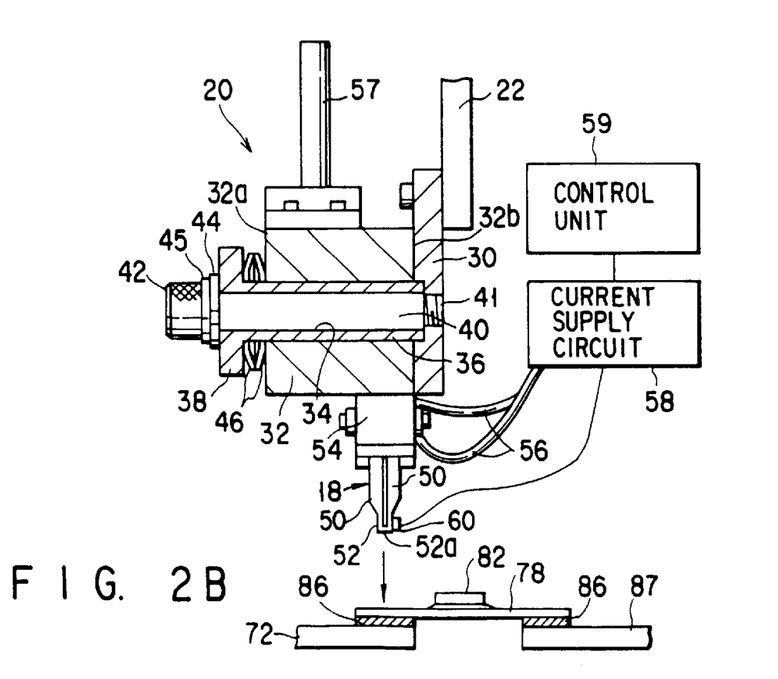

As shown in FIGS. 2A and 2B, the thermocompression bonding head device 20 includes a planar base portion 30 fixed to the air cylinder 22, a cubic support block 32 rotatably supported by the base portion, and the heater tool 18 fixed to the support block.

The support block 32 has a through hole 34, which is formed to extend through the central portion of the block 32 and has a circular section. This through hole 34 is open to a front surface 32a and a rear surface 32b of the support block 32. A cylindrical sleeve 36 is inserted into the through hole 34 from the front surface 32a side of the support block 32. The support sleeve 36 has a predetermined diameter with respect to the through hole 34, and is rotatably fitted in the through hole 34 in a predetermined fitting state.

One end of the support sleeve 36 protrudes from the rear surface 32b of the support block 32, and is fitted into the base portion 30. A flange 38 is formed at the other end of the support sleeve 36, and faces the front surface 32a of the support block 32 with a predetermined interval therebetween.

A rotation shaft 40 is inserted into the support sleeve 36 from the flange 38 side. The rotation shaft 40 is fitted into the inner hole of the support sleeve 36 in a predetermined fitting state, and is rotatable with respect to the support sleeve. The rotation shaft 40 has a distal end portion 41 projecting from the support sleeve 36. A threaded portion is formed on the distal end portion 41, and is screwed into the base portion 30. A large-diameter head portion 42 is formed at the other end side of the rotation shaft 40, and contacts the flange 38 via a plain washer 44 and a spring washer 45.

By screwing the distal end portion 41 of the rotation shaft 40 into the base portion 30 by means of the head portion 42, the support sleeve 36 is fastened and fixed to the base portion. The support block 32 is rotatably supported by the support sleeve 36.

A pair of belleville springs 46 are inserted between the flange 38 of the support sleeve 36 and the front surface 32a of the support block 32 while being wound around the support sleeve 36. The support block 32 is biased toward the base portion 30 by these belleville springs 46, and its rear surface 32b is in tight contact with the base portion 30. With this structure, cluttering of the support block 32 in the axial direction of the support sleeve 36 is suppressed.

Furthermore, a pair of set screws 48 serving as lock means are screwed into the base portion 30 from the front surface 32a side of the support block 32 via the support block 32. By fastening these set screws 48, the support block 32 is locked at a predetermined rotational position. Plain washers (not shown) and spring washers 51 are interposed between the head portions of the set screws 48 and the front surface 32a of the support block 32.

On the other hand, the heater tool 18 has a pair of opposing leg portions 50 which are parallelly separated by a predetermined interval, and a distal end portion 52 which couples the one-end portions of these leg portions, and is formed into a nearly U shape. The distal end portion 52 has a flat bottom surface 52a, which extends horizontally. The heater tool 18 is formed of, e.g., iron, and the distal end portion 52 is formed to be sufficiently thin, so as to obtain the highest electrical resistance possible. The width of the distal end portion 52 is set to be about 20 to 30 mm.

The heater tool 18 with the above arrangement is detachably fixed to the support block 32 by fixing the pair of leg portions 50 to a shank 54 fixed to the lower surface of the support block 32. The shank 54 is formed by plating the surface of a conductive material, e.g., copper, with gold, and is connected to a current supply circuit 58 and a control unit 59 via a current supply lines 56. When current is supplied from the current supply circuit 58, the heater tool 18 is energized via the shank 54, and the distal end portion 52 with high electrical resistance of the heater tool produces Joule heat according to the supplied currents.

A thermocouple 60 for detecting the temperature of the heater tool 18 is attached to the heater tool 18, and inputs a detection signal to the control unit 59.

An adjustment lever 57 is fixed to the upper surface of the support block 32 via a bracket, and projects in the radial direction of the support sleeve 36. The length of the adjustment lever 57 is set to be 80 to 150 mm. By rotating the support block 32 about the support sleeve 36 by pressing the distal end portion of the adjustment lever 57, the heater tool 18 rotates together with the support block 32, and the degree of parallelism of the bottom surface 52a of the heater tool with respect to the portion to be compression bonded can be adjusted.

The thermocompression bonding apparatus comprises a current supply circuit 58 serving as current supply means for supplying current to the heater tool 18 so as to heat it, and a control unit 59 for controlling the operation of the current supply circuit 58.

Figure 3:
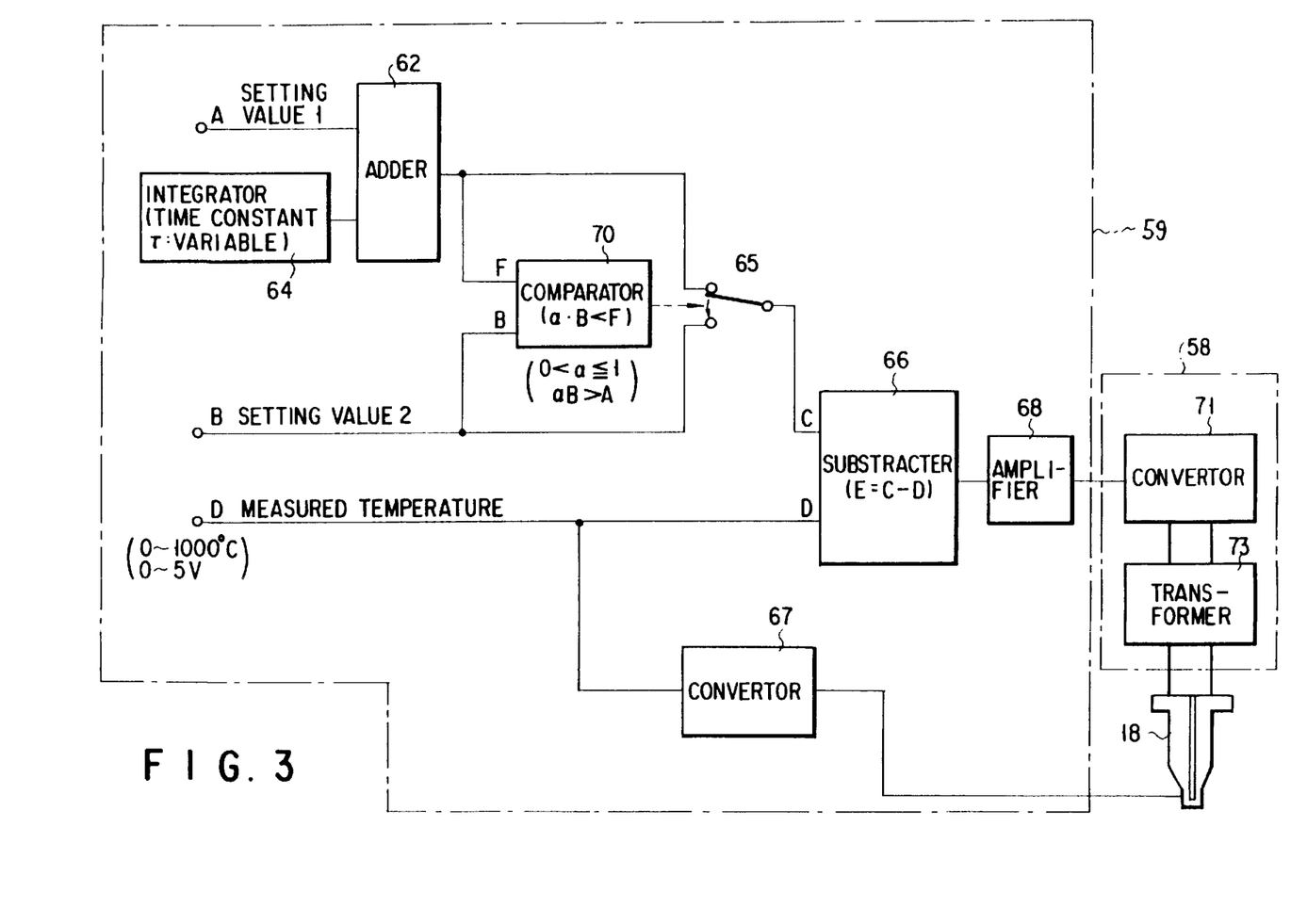
FIG. 3 is a block diagram showing a control unit and a current supply circuit of the apparatus.
Figure 4:
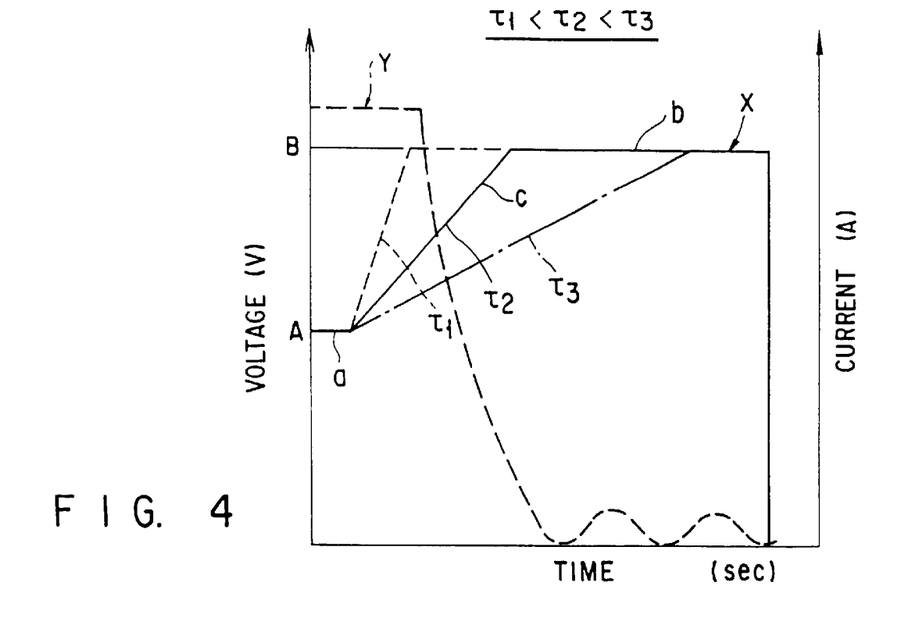
FIG. 4 is a graph schematically showing a setting voltage waveform and a current waveform.

As shown in FIGS. 3 and 4, the control unit 59 has an adder 62, into which a predetermined setting value 1 is input. The setting value 1 is, for example, a voltage of 0.5 V. The adder 62 also receives an output which increases at a predetermined rate (time constant τ: variable), from an integrator 64, and adds the output to the setting value 1. As a consequence, the output from the adder 62 increases gradually.

The output from the adder 62 is compared by a comparator 70 with setting value 2, e.g., a voltage of 1.5 V, and is input to one of the terminals of a subtracter 66. The output from the adder 62 reaches the setting value 2 by about 3 seconds, and at this time, a switch 65 is switched. With this switching operation, hereinafter, an output corresponding the setting value 2 is input to the subtracter 66 by about 17 seconds. In FIG. 4, a solid line X represents a setting voltage waveform which is input to the one of the input terminals of the subtracter 66 through the switch 65. In this embodiment, the temperature of the heater tool 18 is controlled based on the setting voltage waveform.

As shown in FIG. 4, the above-mentioned setting voltage waveform includes a first level region a corresponding to the setting value 1, a second level region b corresponding to the setting value 2, and an inclined region c interposed between these first and second level regions. By changing the time constant of the integrator 64 to τ1, τ2, and τ3 (τ1<τ2<τ3), a voltage c to be input to the subtracter 66 is adjusted, thereby adjusting the slope of the inclined region c. The adjustment is performed in response to an input operation of the operation panel 28.

A convertor 67 is connected to the other input terminal of the subtracter 66. The convertor 67 converts the signal from the thermocouple 60, which is fixed to the heater tool 18, to a voltage and input it to the subtracter 66. Thereafter, the output from the substrate 66 is controlled while feeding back the temperature measured by the thermocouple 60 so that the change in the temperature of the heater tool 18 substantially corresponds to the setting voltage waveform.

The output voltage from the subtracter 66, which is under the feeding back control, is amplified by an amplifier 68 and input to the current supply circuit 58. As shown in FIG. 3, the current supply circuit 58 includes a voltage-current convertor 71 with a thyristor unit, and a current supply section 73 formed of a transformer, and supplies AC current to the heater tool 18 in accordance with the input voltage. In FIG. 4, chained line Y schematically represents the AC current actually supplied to the heater tool 18.

Figure 5:
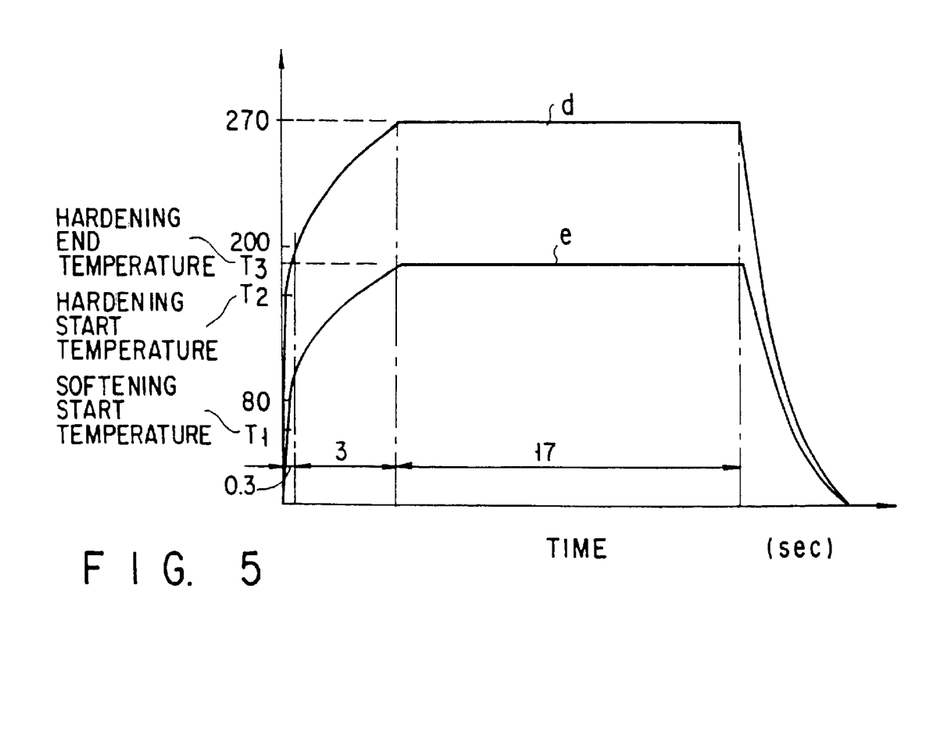
FIG. 5 is a graph showing the changes in temperature of a heater tool and an anisotropic conductive adhesive film in the thermocompression bonding head device.

When AC current is supplied to the heater tool 18 bay means of the control unit 59 and the current supply circuit 58, the temperatures of the heater tool 18 and anisotropic conductive adhesive film 68 rise as shown by lines d and e in FIG. 5, respectively. As an anisotropic conductive adhesive film, CP7131 obtained from Sony Chemical Corporation has been used.

As indicated by line d in FIG. 5, the temperature of the heater tool 18 is rapidly raised to 200° C. As indicated by line e in FIG. 5, the temperature of the anisotropic conductive adhesive film is raised to about 80° C., which is higher than the softening starting temperature T1, i.e., 50° C. within about 0.3 seconds, in response to the temperature rise of the heater tool 18. It is preferable that the initial temperature of the heater tool 18 is set to be higher than the softening start temperature T1 of the anisotropic conductive adhesive film and lower than the thermosetting (hardening) end temperate T3. Depending on the type of the anisotropic conductive adhesive film, the initial temperature of the tool 18 is set to be 40 to 100° C.

In this invention, a softening start temperature T1 is a temperature at which the anisotropic conductive adhesive deforms after initially deforming, and is measured under the pressure of 5 Kg/cm². In this embodiment, the softening start temperature of the anisotropic conductive adhesives film was 50° C.

Based on the setting voltage waveform, the temperature of the heater tool 18 slowly rises from 200° C. to 270° C. within 3 seconds. Thereafter, the temperature of the heater tool 18 is maintained 270° C. for about 17 seconds. In accordance with the temperature of the heater tool 18, the anisotropic conductive adhesive film is gently heated to 180° C. corresponding to the thermosetting end temperature T3, and then maintained at this temperature for about 17 seconds.

In this embodiment, the anisotropic conductive adhesive film is heated to the thermosetting end temperature within 3 seconds, as described above. However, this rising time can be changed by adjusting the time constant so as to change the slant of the inclined region c in the setting voltage waveform.

For example, in a range in which shifts between the array substrate and the TCP does not occur, the rising time may be shorter or longer than 3 seconds. However, if the slant of the inclined region c is reduced so as to extend the rising time, the period of thermocompression bonding time increases. Thus, the rising time is desirable to be set as short as possible, particularly, to be set in a range of 1 to 5 seconds.

Figure 6:
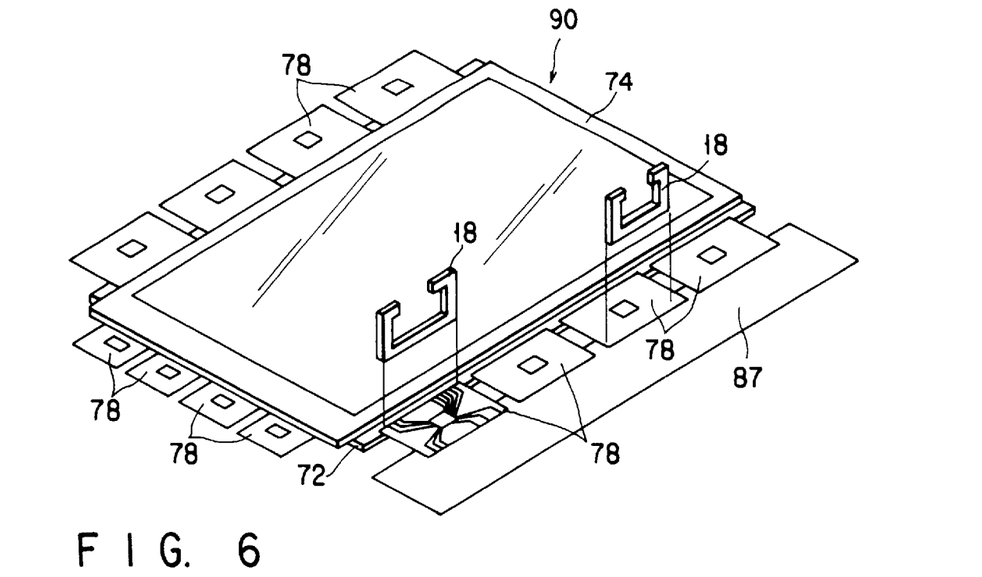
FIG. 6 is a perspective view showing a liquid crystal display panel, TCP, and driving circuit to be thermocompression bonded by the thermocompression bonding apparatus.
Figure 7:
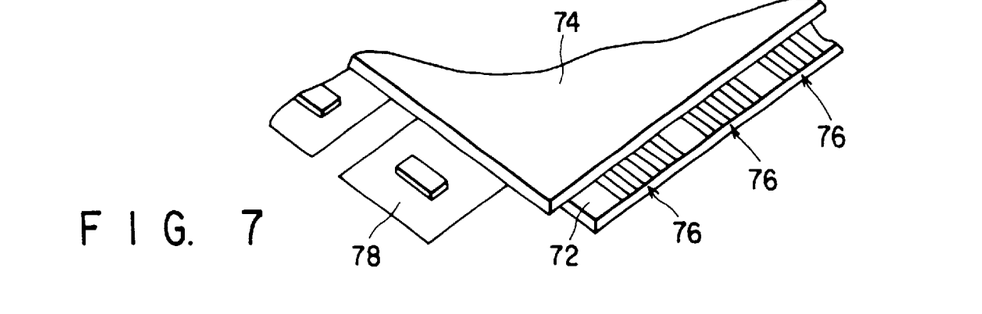
FIG. 7 is a partially enlarged perspective view of the liquid crystal display panel.
Figure 8:
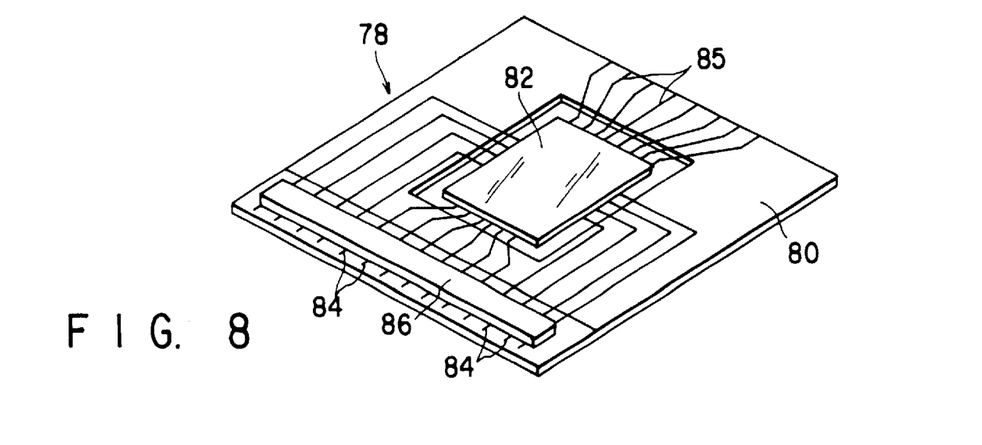
FIG. 8 is an enlarged perspective view of the TCP.

There will now be described a liquid crystal display panel, TCP, and driving circuit board which are to be thermocompression bonded by using the abovementioned thermocompression bonding apparatus. As shown in FIGS. 6 to 8, a liquid crystal display panel 90 comprises an array substrate 72 and a opposing substrate 74, which are arranged to oppose each other with a predetermined gap, and a liquid crystal (not shown) sealed between these boards. A conductor pattern including signal lines, scanning lines, and the like is formed on the array substrate 72, and a large number of parallel leads 76 (first conductor) electrically connected to the conductor pattern are formed on the side edge portions of the array substrate with predetermined intervals.

Each of a plurality of TCPs 78 to be connected to the array substrate 72 has a rectangular flexible printed wiring board 80 (to be referred to as an FPC hereinafter), and a driving IC chip 82 mounted on the FPC. Also, each FPC 80 has a large number of output leads 84 (second conductor) arranged on its one end portion, and a large number of input leads 85 arranged on the other end portion. The output leads 84 are electrically connected to the IC chip 82, and are juxtaposed parallel to each other at the same pitch as that of the leads 76 on the array substrate 72. The input leads 85 are electrically connected to the IC chip 82, and are juxtaposed parallel to each other at the same pitch as that of leads (not shown) of a driving circuit board 87.

A case will be explained below wherein the TCPs 78 are thermocompression bonded onto the array substrate 72 of the liquid crystal panel 90, and the driving circuit board 87 is then thermocompression bonded to the TCPs.

As shown in FIG. 8, an elongated sheet-like anisotropic conductive adhesive film 86 is adhered onto the large number of output leads 84 arranged at one end portion of the FPC 80 of each TCP. The anisotropic conductive adhesive film 86 is formed into a sheet shape by dispersing conductive particles such as nickel, solder, and the like into, e.g., a thermosetting resin.

Figure 9:
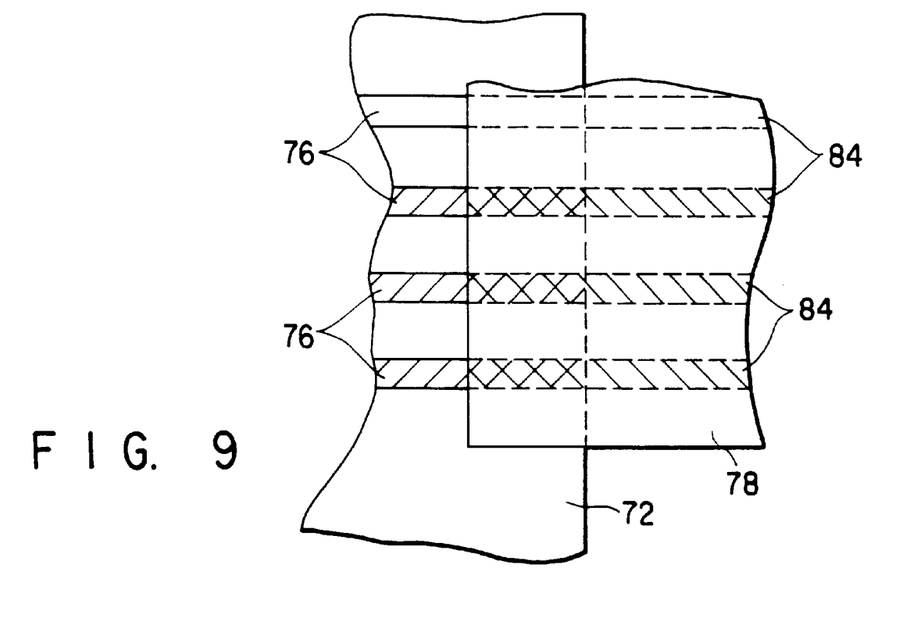
FIG. 9 is a plan view showing the state wherein the TCP is aligned on an array substrate of the liquid crystal display panel.
Figure 10:
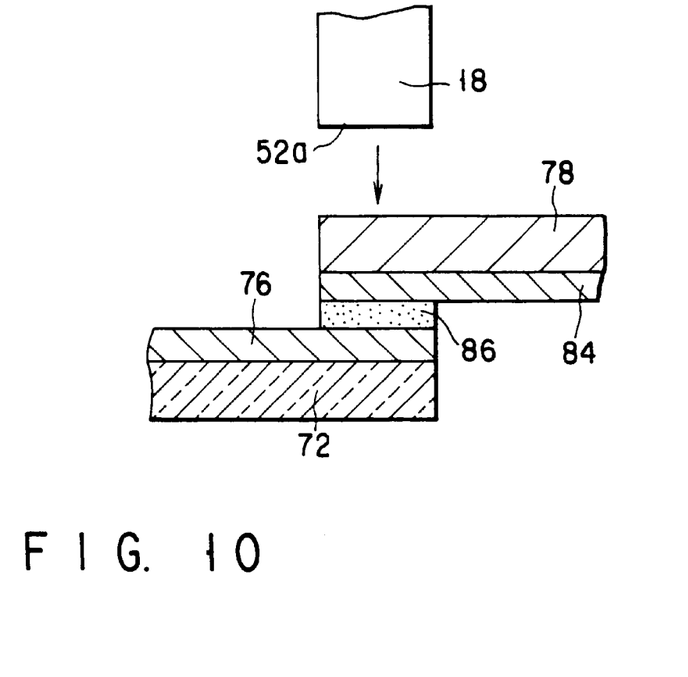
FIG. 10 is a sectional view showing the state wherein the TCP is aligned on the array board of the liquid crystal display panel.

Subsequently, as shown in FIGS. 6, 9, and 10, the one-end portion of each TCP 78 is stacked on the array substrate 72 to interpose the anisotropic conductive adhesive film 86 therebetween while accurately aligning the predetermined leads 76 of the array substrate 72 with the output leads 84 of the TCP 78. Thus, they are temporarily bonded. In this state, the liquid crystal display panel 90 and the plurality of TCPs 78 are placed on the stage 16 of the thermocompression bonding apparatus.

The X-Y table 14 is actuated via the operation panel 28 to move the stage 16 to a position where the temporarily bonded portion between the liquid crystal display panel 90 and each TCP 78 aligns with the distal end portion 52 of the heater tool 18. Thereafter, the air cylinder 22 is driven to move the thermocompression bonding head device 20 downward, so as to press the bottom surface 52a of the distal end portion 52 of the heater tool 18 against the connection portion of the TCP 78 from above, and press the TCP toward the array substrate 72. The heater tool 18 applies heat and pressure to the TCP 78, array substrate 72, and the anisotropic conductive adhesive film 86, thereby mechanically and electrically press-bonding them permanently.

In this case, the heater tool 18 applies heat and pressure as follows. As indicated by a curve B in FIG. 11, the compression force to be applied from the heater tool 18 to the TCP 78 is immediately raised to a predetermined value (10 to 20 kg) by the air cylinder 22, and thereafter, the compressing state is maintained for a predetermined period of time. With this operation, sufficiently high pressure is applied to the TCP 78, anisotropic conductive adhesive film 86, and array substrate 72.

Figure 11:
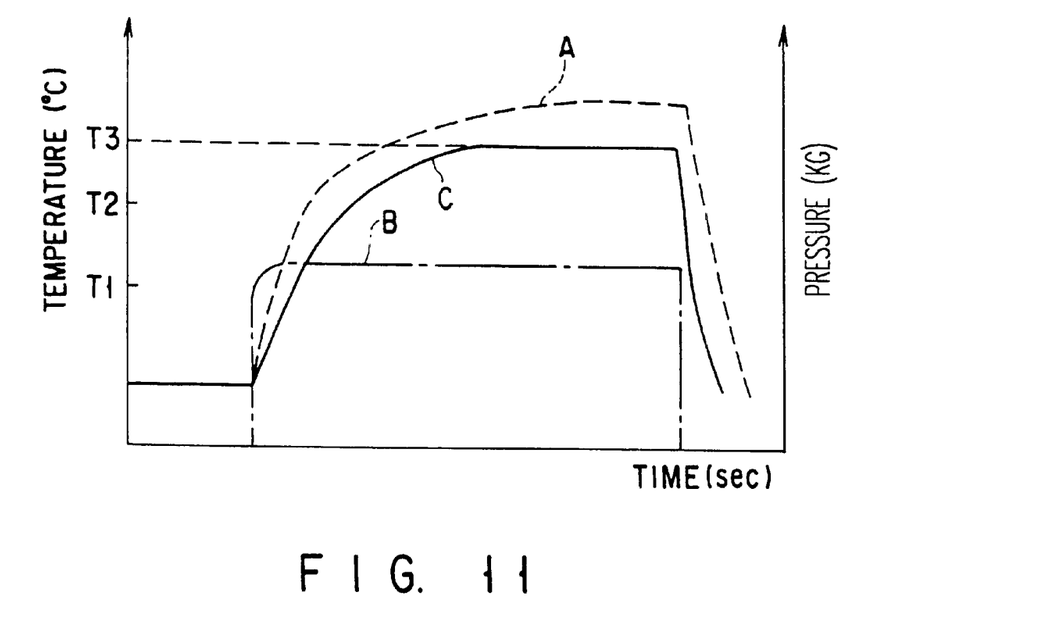
FIG. 11 is a graph showing changes in pressure and temperature of the heater tool and changes in temperature of an anisotropic conductive adhesive film upon thermocompression bonding.

The current supply circuit 58 supplies AC current to the heater tool 18, so that the temperature of the heater tool is immediately raised from the room temperature to 200° C. corresponding to the setting value 1 simultaneously with the pressure rise, immediately thereafter gently raised from 200° C. to 270° C. corresponding to the setting value 2, and thereafter, is maintained at 270° C. for a predetermined period of time (about 17 seconds), as indicated by a curve A in FIG. 11. With this operation, the anisotropic conductive adhesive film 86 is continuously heated by the heater tool 18 via the TCP 78, and its temperature is immediately raised from room temperature to a temperature (about 80° C.) slightly higher than the softening starting temperature T1, is immediately thereafter slowly raised to a thermosetting end temperature T3 (180° C.) via a thermosetting starting temperature T2, and thereafter, is maintained at the thermosetting end temperature for a predetermined period of time, as indicated by a curve C in FIG. 11.

Then, the thermocompression bonding head device 20 is moved upward by driving the air cylinder 22.

Thereafter, the above mentioned thermocompression bonding is repeated as the temperature of the heater tool 18 is lowered to about the level corresponding to the setting value 1, without waiting that the temperature of the tool 18 lowers to room temperature.

With the above-mentioned operations, the resin of the anisotropic conductive adhesive film 86 temporarily softens and recedes upon heating and, thereafter, hardens, and each TCP 78 is mechanically fixed to the array substrate 72. At the same time, the conductive particles dispersed in the resin of the anisotropic conductive adhesive film 86 are locally connected, thus electrically connecting the leads 76 of the array substrate 72 and the corresponding output leads 84 of the TCP 78.

Connections between the input leads 85 formed on the other end portion of each TCP 78 and electrodes (not shown) of the driving circuit board 87 are attained by the same operations as described above. In this case, solder is used in place of the anisotropic conductive adhesive film. Also, a pressure of about 4 kg is applied to the heater tool 18.

According to the thermocompression bonding method and apparatus with the above-mentioned arrangement, thermocompression bonding is attained by slowly raising the temperature of the anisotropic conductive adhesive film 86 from room temperature to the thermosetting end temperature T3. Therefore, the anisotropic conductive adhesive film can be prevented from abruptly softening and spreading to lower the compression force applied to the TCP 78 upon thermocompression bonding. Accordingly, a predetermined pressure can always be applied to the TCP 78, anisotropic conductive adhesive film 86, and array substrate 72 during thermocompression bonding, thereby preventing them from suffering positional shifts. As a consequence, electrical connection errors between the leads 76 and 84 can be prevented, and a stable connecting state can always be guaranteed.

Figure 12:
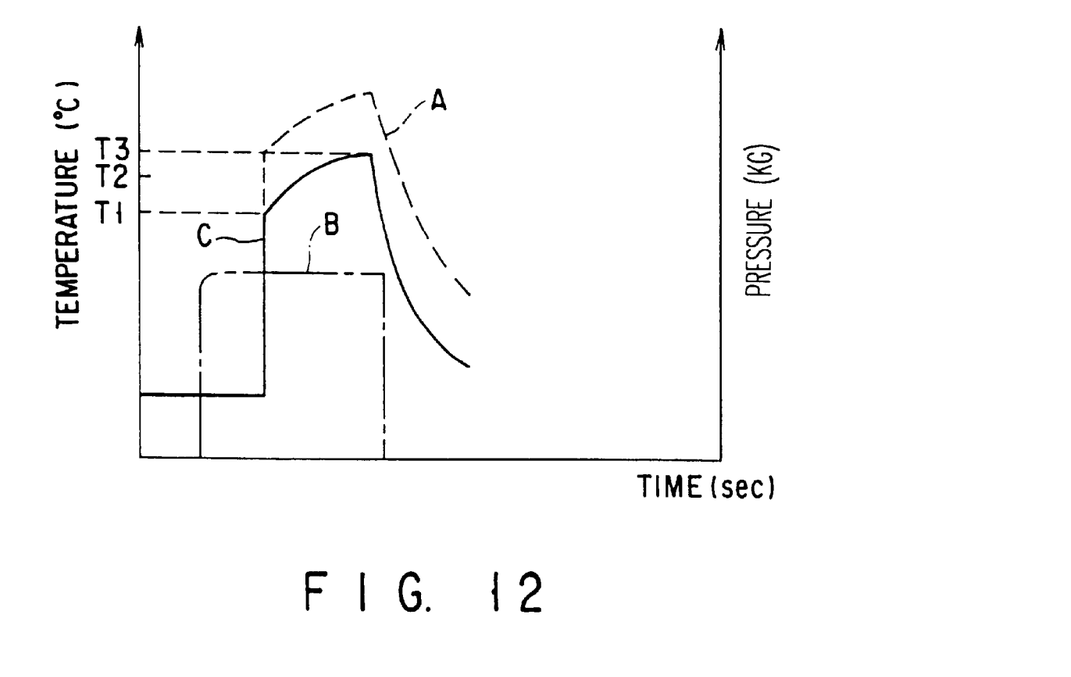
FIG. 12 is a graph showing changes in pressure and temperature of the heater tool and changes in temperature of an anisotropic conductive adhesive film upon thermocompression bonding according to another embodiment of the present invention.

Note that the heater tool 18 may apply heat and pressure, as shown in FIG. 12. First, the compression force applied by the heater tool 18 is abruptly raised to a predetermined pressure, so as to sufficiently compress the TCP 78, anisotropic conductive adhesive film 86, and array substrate 72, as indicated by a curve B. Subsequently, as indicated by a curve A, the temperature of the heater tool 18 is abruptly raised up so that the anisotropic conductive adhesive film 86 is heated to the softening start temperature T1, and thereafter, is slowly raised to 270° C. corresponding to the setting value 2. With this control, as indicated by a curve C, the anisotropic conductive adhesive film 86 is instantaneously heated from room temperature to the softening start temperature T1, and thereafter, is slowly heated to the hardening end temperature T3.

In this way, since the temperature of the anisotropic conductive adhesive film 86 is instantaneously raised to the softening start temperature T1, and thereafter, is slowly raised up to the hardening temperature T3, the anisotropic conductive adhesive film can be prevented from abruptly softening and receding and positional shifts between the TCP 78 and the array substrate 72 can be prevented, as in the above-mentioned embodiment. Also, since the hardening reaction time of the anisotropic conductive adhesive film 86 corresponds to the duration from the hardening start temperature T2 to the hardening end temperature T3, the time required for thermocompression bonding can be shortened.

Note that the present invention is not limited to the above-mentioned embodiment, and various modifications may be made within the scope of the invention. For example, the thermocompression bonding method and apparatus according to the present invention can be applied not only to thermocompression bonding between the TCPs and the array substrate but also to thermocompression bonding between other electronic components.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermocompression bonding method for electrically and mechanically connecting a conductor of a first electronic component and a conductor of a second electronic component by thermocompression bonding the conductors of the first and second electronic components via a thermosetting type anisotropic conductive adhesive, the method comprising:

a step of stacking the conductors of the first and second electronic components to each other with interposing the thermosetting type anisotropic conductive adhesive therebetween;

after said step of stacking, a first step of applying pressure and heat to the anisotropic conductive adhesive via one of the first and second electronic components to heat the anisotropic conductive adhesive to a first temperature between a softening start temperature and a hardening start temperature of the anisotropic conductive adhesive; and a second step, performed immediately after the first step, of heating the anisotropic conductive adhesive continuously without a decrease in temperature from the first temperature to a hardening end temperature of the anisotropic conductive adhesive;

wherein a period of time for heating the anisotropic conductive adhesive to the hardening end temperature in the second step is longer than a period of time of heating the anisotropic conducive adhesive to the first temperature in the first step so as to prevent melting and receding of the anisotropic conductive adhesive in the second step, thereby preventing positional shifts between the first and second conductors of the electronic components.

2. A method according to claim 1, further comprising a step of maintaining the anisotropic conductive adhesive at the hardening end temperature so as to harden the anisotropic conductive adhesive, after the second step.

3. A method according to claim 1, wherein the first temperature is in a range of 40 to 100° C.

4. A method according to claim 1, wherein the second step is performed in a range of 1 to 5 seconds.

5. A method according to claim 1, wherein, in the first and second steps, the anisotropic conductive adhesive is heated by a thermocompression bonding head for generating Joule heat in accordance with a current supplied thereto.

6. A method according to claim 5, wherein the thermocompression bonding head includes temperature detecting means for detecting temperature, further comprising:

supplying a current to said thermocompression bonding head in accordance with a detection output of the temperature detecting means.

7. A method according to claim 1, wherein the conductor of the first electronic component is mounted on a glass substrate for a liquid crystal display device.

8. A method according to claim 1, wherein the conductor of the second electronic component is disposed in a tape carrier package.

9. A method according to claim 1, wherein the anisotropic conductive adhesive is formed of a thermosetting resin film dispersed with metal fine particles.

10. A method according to claim 1, further comprising a step of applying pressure to the anisotropic conductive adhesive via one of the first and second electronic components to temporarily bond the first and second conductors, before the first step.

11. A thermocompression bonding method for electrically and mechanically connecting a conductor of a first electronic component and a conductor of a second electronic component by thermocompression bonding the conductors of the first and second electronic component via a thermosetting type anisotropic conductive adhesive, the method comprising:

- a step of stacking the conductors of the first and second electronic components to each other with interposing the thermosetting type anisotropic conductive adhesive therebetween;
- after said step of stacking, a first step of applying pressure to the anisotropic conductive adhesive via one of the first and second electronic components by using a thermocompression bonding head for generating Joule heat in accordance with a current supplied thereto, and heating the anisotropic conductive adhesive to a temperature between a softening start temperature and hardening start temperature of the anisotropic conductive adhesive by heating the thermocompression bonding head to a first temperature; and
- a second step, performed immediately after the first step, of heating the anisotropic conductive adhesive to a hardening end temperature of the anisotropic conductive adhesive by controlling the current applied to the thermocompression bonding head so as to heat the thermocompression bonding head continuously without a decrease in temperature from the first temperature to a second temperature which is higher than the first temperature;
- wherein a period of time for heating the anisotropic conductive adhesive to the hardening end temperature in the second step is longer than a period of time of heating the anisotropic conductive adhesive to the first temperature in the first step so as to prevent melting and receding of the anisotropic conductive adhesive in the second step, thereby preventing positional shifts between the first and second conductors of the electronic components.

12. A method according to claim 11, wherein the second step is performed in a range of 1 to 5 seconds.

13. A method according to claim 11, wherein the current to be applied to the thermocompression bonding head is controlled based on a setting voltage waveform.

* * * * *

UNITED STATES PATENT AND TRADEMARK OFFICE
CERTIFICATE OF CORRECTION

PATENT NO.   : 6,336,990 B1  
DATED        : January 8, 2002  
INVENTOR(S)  : Tanaka et al.

It is certified that error appears in the above-identified patent and that said Letters Patent is hereby corrected as shown below:

<u>Title page,</u>  
Item [45], the Date of Patent should read:  
-- [45] Date of Patent:         *Jan. 8, 2002 --  
Item [62], Related U.S. Application Data should read:  
                -- Related U.S. Application Data  
[62]    Division of application No. 08/807,081, filed on Feb. 27, 1997, now Pat. No. 5,810,959. --

<u>Column 1,</u>  
Line 8, the first paragraph should read: -- This application is a division and claims priority to parent application Ser. No. 08/807,081 filed Feb. 27, 1997, now U.S. Pat. No. 5,810,959. --

Signed and Sealed this

Twenty-fourth Day of September, 2002

*Attest:*

JAMES E. ROGAN  
*Director of the United States Patent and Trademark Office*

*Attesting Officer*